US009859790B2

United States Patent
Lin et al.

(10) Patent No.: US 9,859,790 B2
(45) Date of Patent: Jan. 2, 2018

(54) POWER DETECTION AND TRANSMISSION CIRCUIT COUPLING ANALOG INPUT SIGNAL ON PRIMARY SIDE TO SECONDARY SIDE FOR POWER INFORMATION CALCULATION AND RELATED POWER SUPPLY APPARATUS

(71) Applicant: FSP TECHNOLOGY INC., Taoyuan (TW)

(72) Inventors: Kuo-Fan Lin, Taoyuan (TW); Fu-Kai Tu, Taoyuan (TW)

(73) Assignee: FSP TECHNOLOGY INC., Taoyuan (TW)

( * ) Notice: Subject to any disclaimer, the term of this patent is extended or adjusted under 35 U.S.C. 154(b) by 0 days.

(21) Appl. No.: 15/469,590

(22) Filed: Mar. 27, 2017

(65) Prior Publication Data

US 2017/0288530 A1 Oct. 5, 2017

Related U.S. Application Data

(60) Provisional application No. 62/315,677, filed on Mar. 31, 2016.

(30) Foreign Application Priority Data

Feb. 20, 2017 (TW) .............................. 106105500 A

(51) Int. Cl.
*H02M 3/04* (2006.01)
*H02M 1/42* (2007.01)
(Continued)

(52) U.S. Cl.
CPC .............. *H02M 3/04* (2013.01); *G01R 21/06* (2013.01); *G01R 21/127* (2013.01); *H02M 1/42* (2013.01); *H02M 1/44* (2013.01); *H02M 7/04* (2013.01)

(58) Field of Classification Search
CPC ............ H02M 3/04; H02M 7/04; H02M 1/42; H02M 1/4225; H02M 1/44; G01R 21/06;
(Continued)

(56) References Cited

U.S. PATENT DOCUMENTS

| 3,015,801 A * | 1/1962 | Kalbfell .................. E21B 47/16 324/323 |
| 7,974,793 B2 * | 7/2011 | Weddle .............. G05B 19/0421 702/122 |
| 8,378,608 B2 * | 2/2013 | Robertson ........... H02M 5/4505 318/438 |

* cited by examiner

*Primary Examiner* — Yemane Mehari
(74) *Attorney, Agent, or Firm* — Winston Hsu

(57) ABSTRACT

A power detection and transmission circuit is provided. The power detection and transmission circuit includes a first conversion circuit, a second conversion circuit and a signal coupling circuit. The first conversion circuit is electrically connected to a power supply module to receive an analog input signal, and is arranged for converting the analog input signal to a first pulse width modulation (PWM) signal. The second conversion circuit is arranged for converting a second PWM signal to an analog regenerated signal, and transmitting the analog regenerated signal to a microcontroller, wherein the microcontroller calculates power information of the power supply module according to the analog regenerated signal. The signal coupling circuit is coupled between the first conversion circuit and the second conversion circuit, and is arranged for coupling the first PWM signal to the second conversion circuit and accordingly generating the second PWM signal.

15 Claims, 9 Drawing Sheets

(51) Int. Cl.
  *H02M 1/44*    (2007.01)
  *H02M 7/04*    (2006.01)
  *G01R 21/127*  (2006.01)
  *G01R 21/06*   (2006.01)

(58) Field of Classification Search
  CPC . G01R 21/127; G05F 1/70; H02J 3/16; Y02E 40/12; Y02E 40/30; Y02E 40/34; Y02B 70/126
  USPC .................. 323/205–210; 318/438, 728, 809
  See application file for complete search history.

POWER DETECTION AND TRANSMISSION CIRCUIT COUPLING ANALOG INPUT SIGNAL ON PRIMARY SIDE TO SECONDARY SIDE FOR POWER INFORMATION CALCULATION AND RELATED POWER SUPPLY APPARATUS

CROSS REFERENCE TO RELATED APPLICATIONS

This application claims the benefit of U.S. provisional application No. 62/315,677, filed on Mar. 31, 2016, the contents of which are incorporated herein by reference.

BACKGROUND OF THE INVENTION

1. Field of the Invention

The disclosed embodiments of the present invention relate to power detection, and more particularly, to a power detection and transmission circuit, which converts an analog input signal on a primary side of a power supply module and couples the resulting signal to a secondary side of the power supply module to thereby calculate power information of the power supply module at the secondary side, and a related power supply apparatus.

2. Description of the Prior Art

A conventional power supply apparatus needs a microcontroller, which is installed on a primary side of the conventional power supply apparatus, to measure an input voltage signal and an input current signal, and also needs a Universal Asynchronous Receiver/Transmitter (UART) interface to transmit a measurement result to a microcontroller installed on a secondary side for system power management. For example, a conventional power supply apparatus 100 shown in FIG. 1 needs a microcontroller 120 installed on a primary side of a power supply module 110 to capture an analog voltage signal carried through a hot line LN and an analog voltage signal carried through a neutral line NT. The power supply apparatus 100 further needs a sensing resistor RS installed on the primary side of power supply module 110 such that the microcontroller 120 can measure an input current signal CT. After voltage and current measurements/calculations are completed, the microcontroller 120 transmits measured/calculated data to a microcontroller 130 installed on a secondary side through the UART interface. Next, the microcontroller 130 collects received measurement information (including detection results of an output voltage $V_O$ and an output current $I_O$), and sends complete system power information (e.g. voltage, current, power consumption, frequency and fan speed information) to a load 400 through a Power Management Bus (PMBus).

However, problems arise when a microcontroller is installed on a primary side to measure an input voltage/current signal. For example, the microcontroller 120 needs an extra voltage regulator and an independent ground path, and has to utilize the extra sensing resistor RS externally disposed on the primary side of the power supply module 110 to measure the input current signal CT, which results in increased power consumption. In addition, as the microcontroller 120 is installed on the primary side and therefore requires an ability to withstand high surge voltages, circuit complexity and cost increase accordingly. Moreover, as the microcontroller 120 needs the UART interface to transmit the calculated data to the microcontroller 130, this increases programming complexity.

Thus, there is a need for a novel power detection structure to simplify circuit designs and reduce manufacturing costs.

SUMMARY OF THE INVENTION

In accordance with exemplary embodiments of the present invention, a power detection and transmission circuit, which converts an analog input signal on a primary side of a power supply module and couples the resulting signal to a secondary side of the power supply module to thereby calculate power information of the power supply module at the secondary side, and a related power supply apparatus are proposed to solve the above-mentioned problems.

According to an embodiment of the present invention, an exemplary power detection and transmission circuit is disclosed. The exemplary power detection and transmission circuit comprises a first conversion circuit, a second conversion circuit and a signal coupling circuit. The first conversion circuit is electrically connected to a power supply module to receive an analog input signal, and is arranged for converting the analog input signal to a first pulse width modulation (PWM) signal. The second conversion circuit is arranged for converting a second PWM signal to an analog regenerated signal, and transmitting the analog regenerated signal to a microcontroller, wherein the microcontroller calculates power information of the power supply module according to the analog regenerated signal. The signal coupling circuit is coupled between the first conversion circuit and the second conversion circuit, and is arranged for coupling the first PWM signal to the second conversion circuit and accordingly generating the second PWM signal.

According to an embodiment of the present invention, an exemplary power detection and transmission circuit is disclosed. The exemplary power detection and transmission circuit comprises a first conversion circuit, a second conversion circuit and a signal coupling circuit. The first conversion circuit is arranged for detecting an input voltage signal and an input current signal of a power supply module, converting the input voltage signal to a first pulse width modulation (PWM) signal, and converting the input current signal to a second PWM signal, wherein the input voltage signal and the input current signal have the same phase. The second conversion circuit is arranged for converting a third PWM signal to a first analog regenerated signal, converting a fourth PWM signal to a second analog regenerated signal, and transmitting the first analog regenerated signal and the second analog regenerated signal to a microcontroller, wherein the microcontroller calculates power information of the power supply module according to the first analog regenerated signal and the second analog regenerated signal. The signal coupling circuit is coupled between the first conversion circuit and the second conversion circuit, and is arranged for coupling the first PWM signal to the second conversion circuit and accordingly generating the third PWM signal, and coupling the second PWM signal to the second conversion circuit and accordingly generating the fourth PWM signal.

According to an embodiment of the present invention, an exemplary power supply apparatus is disclosed. The exemplary power supply apparatus comprises a power supply module, a power detection and transmission circuit and a microcontroller. The power supply module comprises an electromagnetic interference filter, a rectifier circuit, a power factor correction circuit and a DC/DC converter circuit. The power detection and transmission circuit comprises a first conversion circuit, a second conversion circuit and a signal coupling circuit. The first conversion circuit is electrically connected to the power supply module to receive an analog input signal, and is arranged for converting the analog input signal to a first pulse width modulation (PWM) signal. The second conversion circuit is arranged for converting a second PWM signal to an analog regenerated signal. The signal coupling circuit is coupled between the first conversion circuit and the second conversion circuit, and is arranged for coupling the first PWM signal to the second conversion circuit and accordingly generating the second PWM signal. The microcontroller is coupled to the second conversion, and is arranged for receiving the analog regenerated signal to calculate power information of the power supply module.

The proposed power detection and transmission structure may calculate complete system power information without the need for a microcontroller installed on a primary side, a UART interface and an extra sensing resistor. Thus, the proposed power detection and transmission structure may not only simplify circuit design but also reduce programming complexity, thereby greatly reducing manufacturing costs.

These and other objectives of the present invention will no doubt become obvious to those of ordinary skill in the art after reading the following detailed description of the preferred embodiment that is illustrated in the various figures and drawings.

DETAILED DESCRIPTION

By converting an analog input signal on a primary side of a power supply module to a pulse width modulation (PWM) signal, and coupling the converted PWM signal to a microcontroller installed on a secondary side of the power supply module, the proposed power detection structure may calculate power information of the power supply module without the need for a microcontroller installed on the primary side of the power supply module. In other words, the proposed power detection and transmission structure may calculate complete system power information without the need for a UART interface and a microcontroller installed on the primary side.

Figure 1:
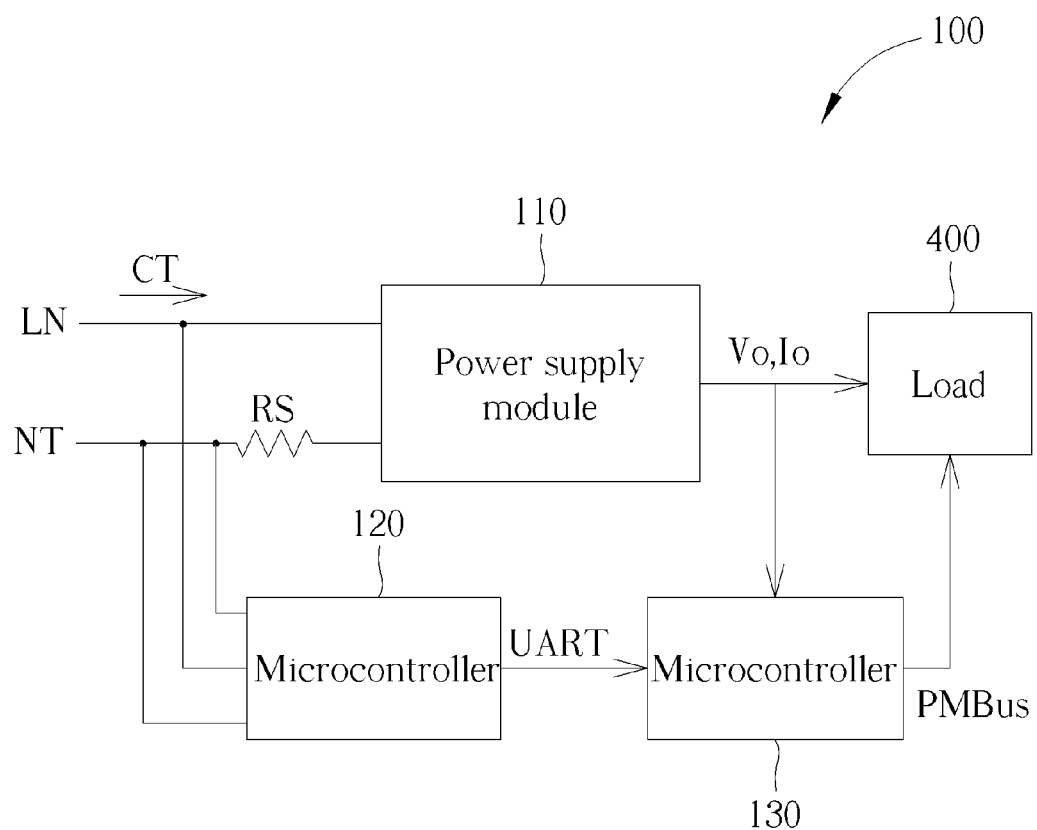
FIG. 1 is a block diagram illustrating a conventional power supply apparatus.
Figure 2:
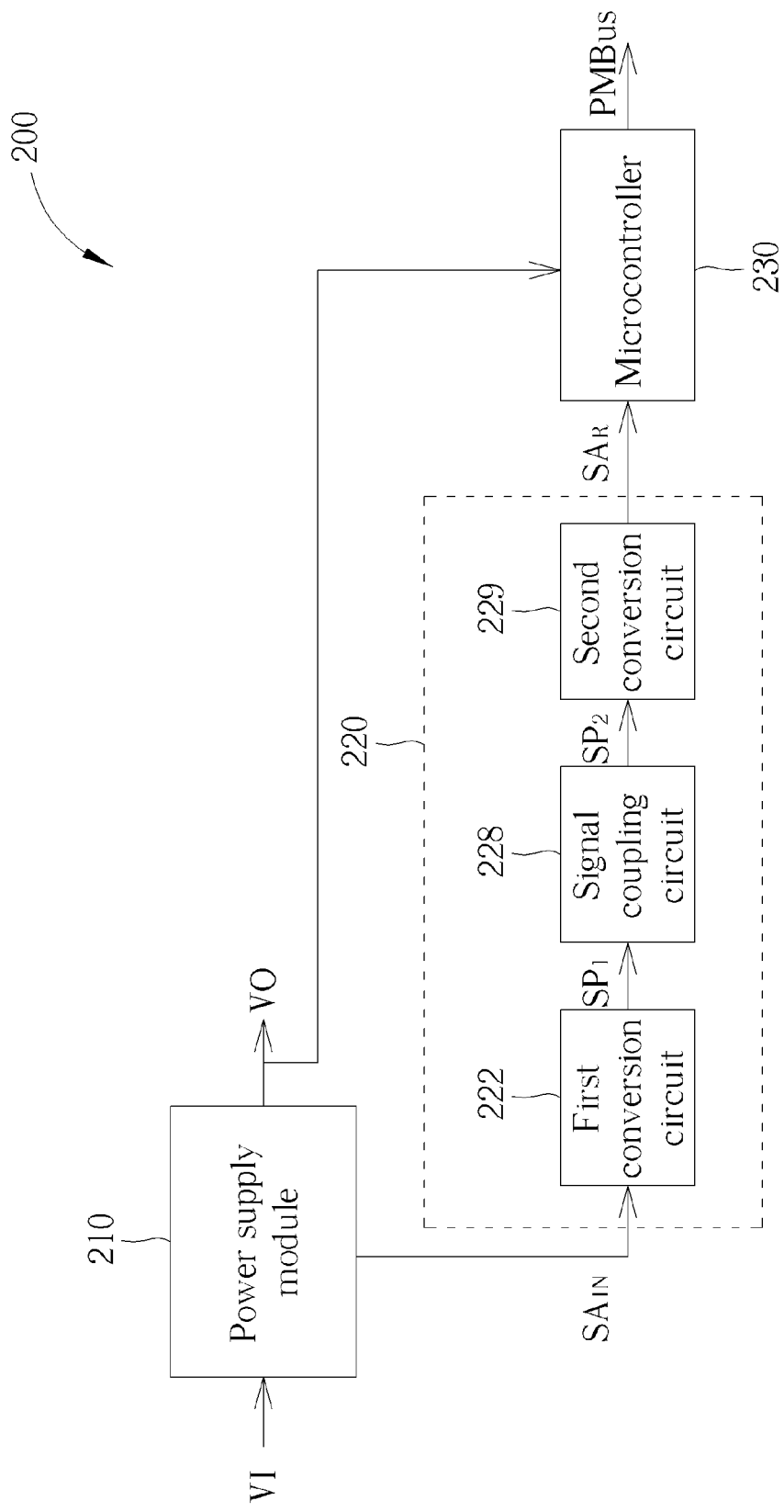
FIG. 2 is a block diagram illustrating an exemplary power supply apparatus according to an embodiment of the present invention.

FIG. 2 is a block diagram illustrating an exemplary power supply apparatus according to an embodiment of the present invention. The power supply apparatus 200 may include, but is not limited to, a power supply module 210, a power detection and transmission circuit 220 and a microcontroller 230. The power supply module 210 may receive an input power VI to generate an output power VO, wherein the power supply module 210 may be implemented by a power supply unit (PSU). The power detection and transmission circuit 220 is electrically connected to the power supply module 210, and may be arranged for receiving an analog input signal $SA_{IN}$ coming from the power supply module 210 (e.g. the analog input signal $SA_{IN}$ may generated in response to the input power VI), and accordingly generating an analog regenerated signal $SA_R$, wherein a signal waveform of the analog regenerated signal $SA_R$ may be similar/identical to that of the analog input signal $SA_{IN}$. Next, the microcontroller 230 may receive the analog regenerated signal $SA_R$ to calculate power information associated with a primary side of the power supply module 210 (or the power supply apparatus 200). Additionally, the microcontroller 230 may detect power information associated with the output power VO (e.g. the microcontroller 230 may receive the output power VO to perform associated power measurements/calculations). Hence, the microcontroller 230 may collect and integrate the power information associated with the primary side and the secondary side of the power supply module 210 (or the power supply apparatus 200), thereby calculating complete power information of the power supply module 210.

In this embodiment, the power detection and transmission circuit 220 may include a first conversion circuit 222, a signal coupling circuit 228 and a second conversion circuit 229. The first conversion circuit 222 is electrically connected to the power supply module 210 to receive the analog input signal $SA_{IN}$, and may convert the analog input signal $SA_{IN}$ to a PWM signal $SP_1$. The signal coupling circuit 228 is coupled between the first conversion circuit 222 and the second conversion circuit 229, and may be arranged for coupling the PWM signal $SP_1$ to the second conversion circuit 229 and accordingly generating a PWM signal $SP_2$. In addition, the second conversion circuit 229 may convert the PWM signal $SP_2$ to the analog regenerated signal $SA_R$. The microcontroller 230 may receive the analog regenerated signal $SA_R$ to perform power calculations, and send complete system power information through a Power Management Bus (PMBus).

In one implementation, the signal coupling circuit 228 may isolate the PWM signal $SP_2$ from the PWM signal $SP_1$ to reduce/eliminate noise interference. In brief, the power detection and transmission circuit 220 may firstly utilize the first conversion circuit 222 to convert the analog input signal $SA_{IN}$ to a digital signal (the PWM signal $SP_1$), and then utilize the signal coupling circuit 228 to couple the digital signal from the primary side of the power supply apparatus 200 to the secondary side of the power supply apparatus 200 to thereby generate another digital signal (the PWM signal $SP_2$). A signal waveform of the digital signal (the PWM signal $SP_1$) is similar/identical to that of the another digital signal (the PWM signal $SP_2$). For example, the main difference between respective signal waveforms of the PWM signals $SP_1$ and $SP_2$ may be the signal amplitude. Finally, the power detection and transmission circuit 220 may utilize the second conversion circuit 229 to refer to the another digital signal to generate the analog regenerated signal $SA_R$, thereby providing the microcontroller 230 with the primary side power information of the power supply apparatus 200. Hence, the power supply apparatus 200 may calculate the complete system power information without the need for a microcontroller installed on the primary side.

Please note that the power detection and transmission circuit 220 shown in FIG. 2 is a basic power detection architecture based on the concept of the present invention. Any circuit employing the architecture shown in FIG. 2 falls within the scope of the present invention. To facilitate an understanding of the present invention, an exemplary implementation is given in the following for further description of the proposed power detection and transmission circuit (or the proposed power supply apparatus). It should be noted that other circuit implementations employing the architecture shown in FIG. 2 are feasible. Please refer to FIG. 3, which is a diagram illustrating an implementation of the power supply apparatus 200 shown in FIG. 2. In this implementation, the power supply apparatus 300 may include a power module 310, a power detection and transmission circuit 320 and a microcontroller 330, wherein the power module 210, the power detection and transmission circuit 220 and the microcontroller 230 shown in FIG. 2 may be implemented by the power module 310, the power detection and transmission circuit 320 and the microcontroller 330 respectively.

The power module 310 may include, but is not limited to, an electromagnetic interference filter (EMI filter) 312, a rectifier circuit 314, a power factor correction (PFC) circuit 316 and a DC/DC converter circuit 318. In this embodiment, the EMI filter 312 is coupled to an input side RI of the rectifier circuit 314, and the PFC circuit 316 is coupled between the rectifier circuit 314 and the DC/DC converter circuit 318. The PFC circuit 316 may perform power factor correction on a signal to be corrected (a voltage signal VA), and accordingly generate a corrected signal (a voltage signal VB) to the DC/DC converter circuit 318. As a person skilled in the art should understand the operation of each circuit element within the power supply module 310, further description is omitted here for brevity.

The power detection and transmission circuit 320 may include a first conversion circuit 322, a photocoupler circuit 328 and a second conversion circuit 329, wherein the first conversion circuit 222, the signal coupling circuit 228 and the second conversion circuit 229 shown in FIG. 2 may be implemented by the first conversion circuit 322, the photocoupler circuit 328 and the second conversion circuit 329 respectively. In this embodiment, the power detection and transmission circuit 320 may detect an input voltage and/or an input current, and transmit the detection result to the microcontroller 330. To facilitate an understanding of the present invention, an example voltage detection and transmission performed by the power detection and transmission circuit 320 is firstly described in the following.

The first conversion circuit 322 may be electrically connected to the input side RI of the rectifier circuit 314 to detect an input voltage signal $V_{IN}$ (i.e. an analog input signal), wherein the input voltage signal $V_{IN}$ may be a signal to be rectified, which is input to the rectifier circuit 314, or a filtered signal generated after the EMI filter 312 filters the input power VI. Hence, the input voltage signal $V_{IN}$ may reflect/indicate voltage information of the input power VI.

After receiving the input voltage signal $V_{IN}$ (the analog input signal), the first conversion circuit 322 may convert the input voltage signal $V_{IN}$ to a corresponding digital signal (e.g. a PWM signal). For example, the first conversion circuit 322 may include, but is not limited to, a signal subtractor 323 (labeled "–"), an oscillator 325 (labeled "OSC") and a comparator 326 (labeled "CP"), wherein the comparator 326 is coupled to the signal subtractor 323 and the oscillator 325. The signal subtractor 323 may subtract one of a line voltage signal $V_1$ (which may indicate voltage information of the hot line LN) and a neutral voltage signal $V_2$ (which may indicate voltage information of the neutral line NT) from the other of the line voltage signal $V_1$ and the neutral voltage signal $V_2$, and accordingly generate a preprocessed signal $V_{ACO}$ to the comparator 326, wherein the line voltage signal $V_1$ and the neutral voltage signal $V_2$ are included in the input voltage signal $V_{IN}$. The oscillator 325 may generate an oscillation signal SS to the comparator 326. Next, the comparator 326 may compare the preprocessed signal $V_{ACO}$ with the oscillation signal SS to generate a PWM signal $SP_{V1}$. In some embodiments, the aforementioned signal subtractor 323 may be implemented by a differential amplifier.

Figure 3:
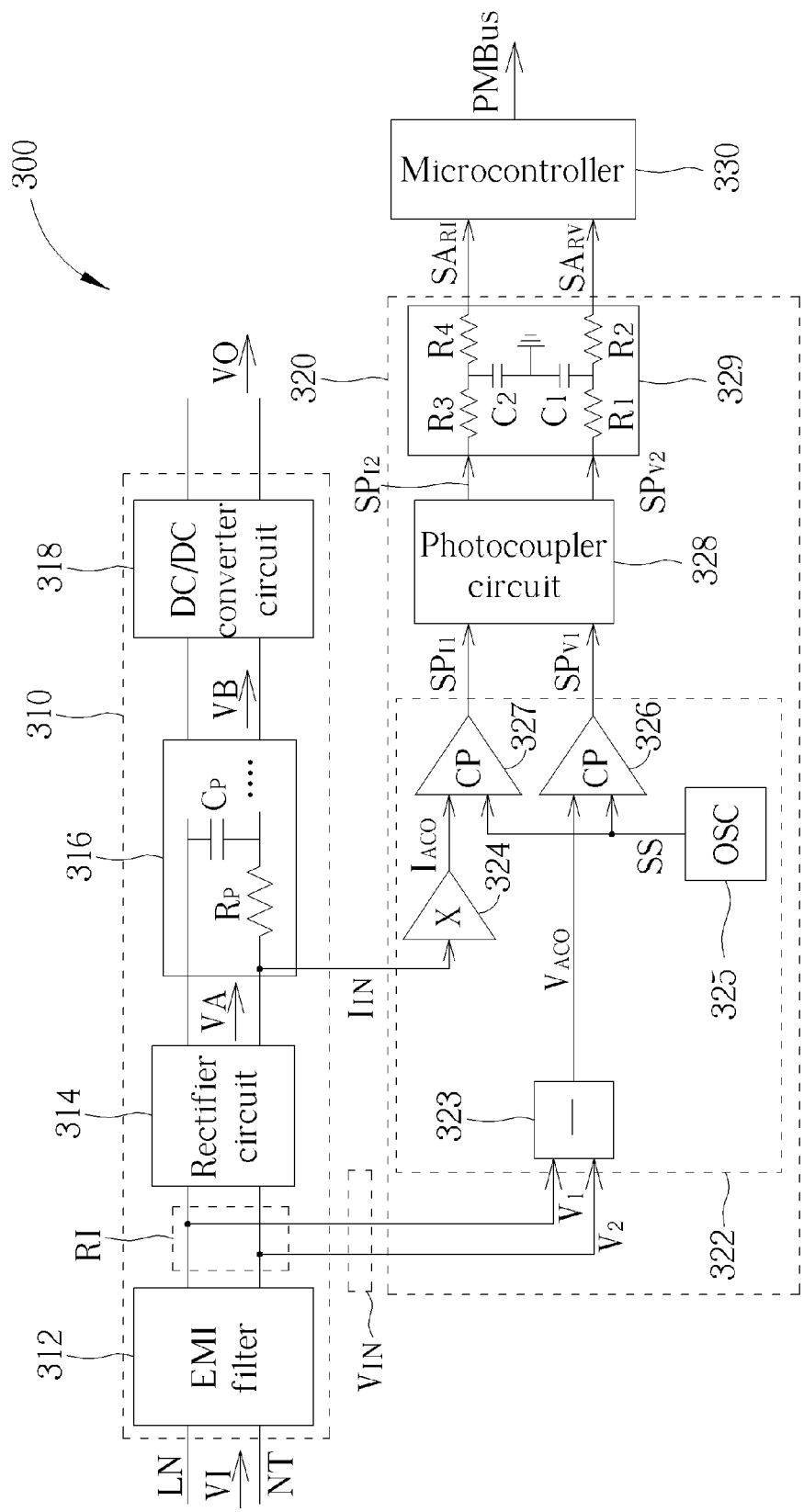
FIG. 3 is a diagram illustrating an implementation of the power supply apparatus shown in FIG. 2.
Figure 4:
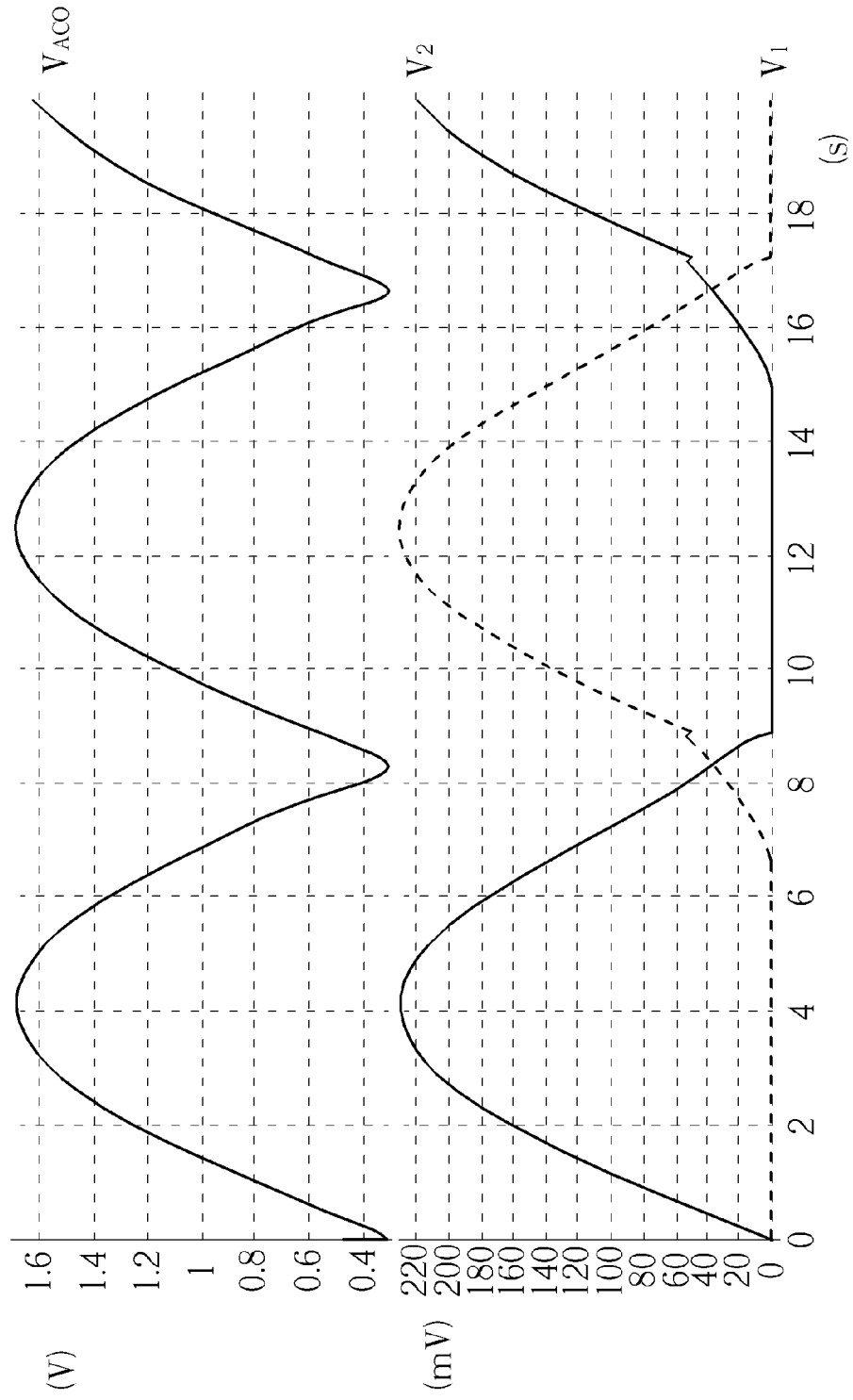
FIG. 4 is a timing diagram showing signal waveforms involved in the operation of the signal subtractor shown in FIG. 3 according an embodiment of the present invention.
Figure 5:
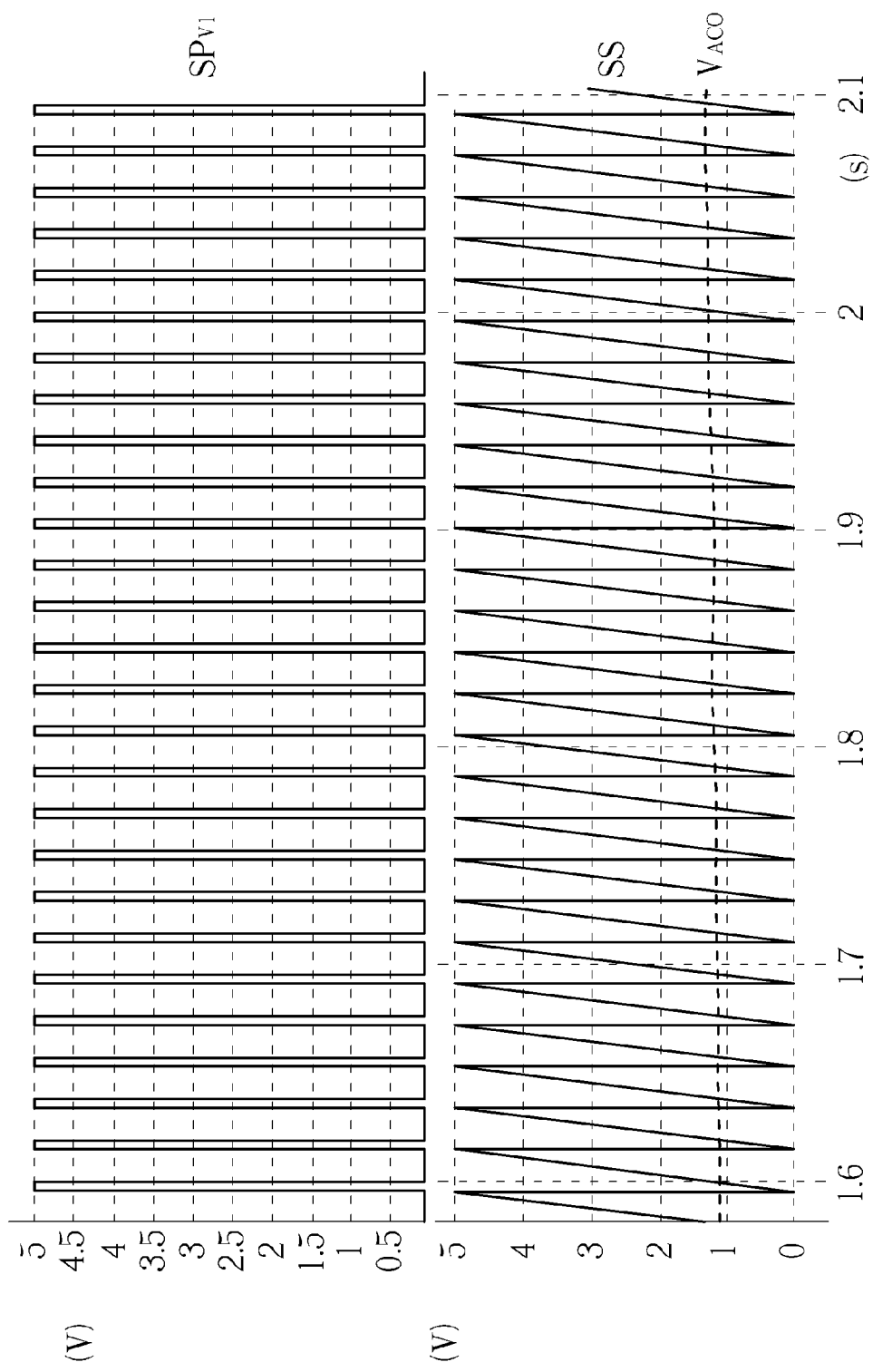
FIG. 5 is a timing diagram showing signal waveforms involved in the operation of the comparator shown in FIG. 3 according an embodiment of the present invention.

FIG. 4 and FIG. 5 are timing diagrams showing signal waveforms involved in voltage signal conversion performed by the first conversion circuit 322 shown in FIG. 3 according to an embodiment of the present invention. First of all, refer to FIG. 4 in conjunction with FIG. 3. FIG. 4 is a timing diagram showing signal waveforms involved in the operation of the signal subtractor 323 according an embodiment of the present invention. In this embodiment, the signal subtractor 323 may subtract the line voltage signal $V_1$ from the neutral voltage signal $V_2$ to generate the preprocessed signal $V_{ACO}$ having a MacDonald waveform, wherein the preprocessed signal $V_{ACO}$ is represented in units of volts (V), each of the line voltage signal $V_1$ and the neutral voltage signal $V_2$ is represented in units of millivolts (mV), and the time is represented in units of seconds (s) along the horizontal axis. It should be noted that the signal subtractor 323 may add a compensation voltage to a result of subtracting the line voltage signal $V_1$ from the neutral voltage signal $V_2$ to generate the preprocessed signal $V_{ACO}$, thereby increasing accuracy of following voltage conversion (e.g. the operation performed in the comparator 326).

Please refer to FIG. 5 in conjunction with FIG. 3. FIG. 5 is a timing diagram showing signal waveforms involved in the operation of the comparator 326 according an embodiment of the present invention. In this embodiment, the comparator 326 may generate the first PWM signal according to the comparison result of the preprocessed signal $V_{ACO}$ and the oscillation signal SS, wherein when a signal level of the preprocessed signal $V_{ACO}$ is greater than a signal level of the oscillation signal SS, the PWM signal $SP_{V1}$ may have a high signal level. Hence, the PWM signal $SP_{V1}$ may indicate signal information of the preprocessed signal $V_{ACO}$.

Figure 6:
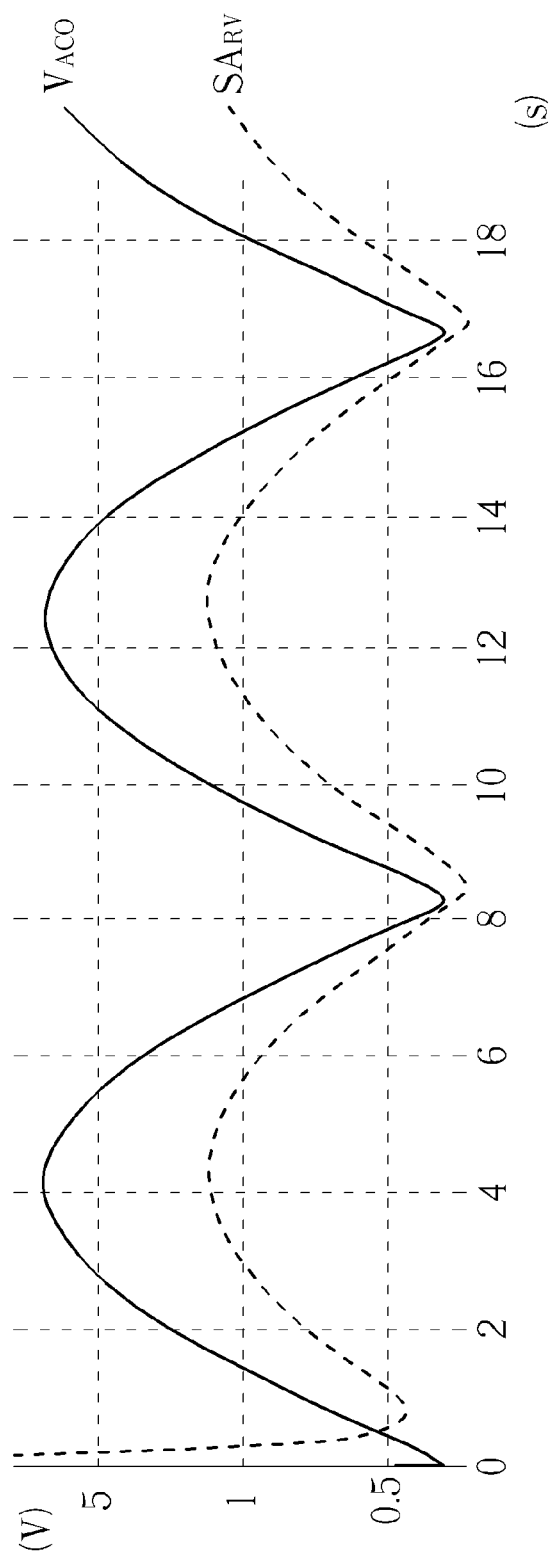
FIG. 6 is a waveform diagram illustrating an output signal of the power detection and transmission circuit shown in FIG. 3 according to an embodiment of the present invention.
Figure 10:
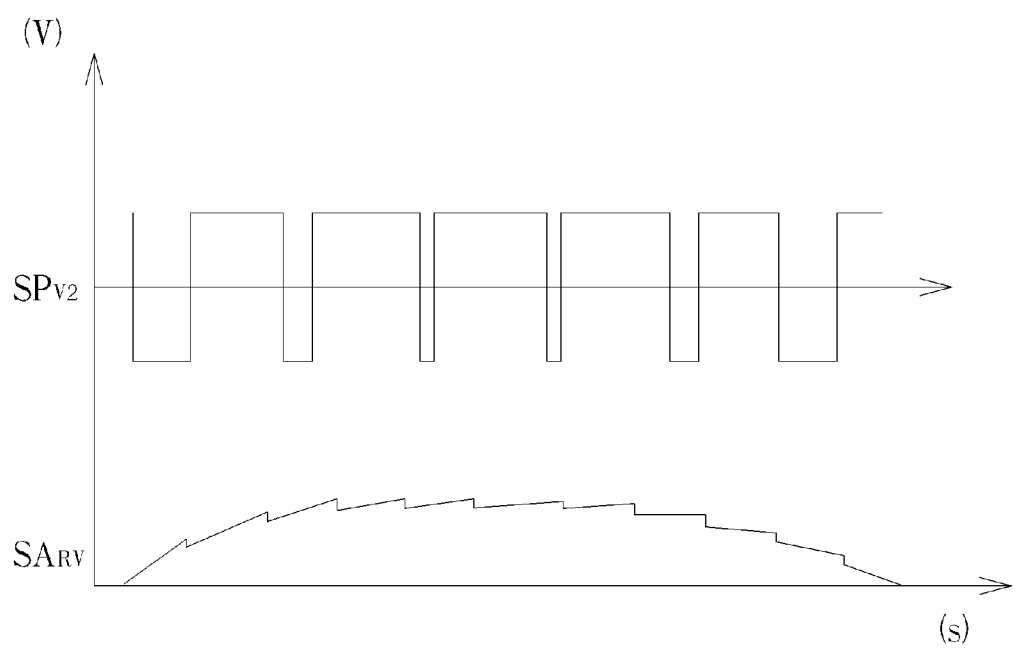
FIG. 10 is a timing diagram showing signal waveforms involved in the second conversion circuit shown in FIG. 3 according an embodiment of the present invention.

After the first conversion circuit 322 generates the PWM signal $SP_{V1}$, the photocoupler circuit 328 may couple the PWM signal $SP_{V1}$ to the second conversion circuit 329, and accordingly generate a PWM signal $SP_{V2}$. Next, the second conversion circuit 329 may convert the PWM signal $SP_{V2}$ to an analog regenerated signal $SA_{RV}$. Please refer to FIG. 6 in conjunction with FIG. 3. FIG. 6 is a waveform diagram illustrating an output signal of the power detection and transmission circuit 320 according to an embodiment of the present invention. In this embodiment, the second conversion circuit 329 may be implemented by a low pass filter circuit, which may include a plurality of resistors $R_1$-$R_4$ and a plurality of capacitors $C_1$-$C_2$, such that the second conversion circuit 329 may perform filter operations upon the PWM signal $SP_{V2}$ to produce the analog regenerated signal $SA_{RV}$, wherein a signal waveform of the analog regenerated signal $SA_{RV}$ may be similar/identical to a signal waveform of the preprocessed signal $V_{ACO}$. Specifically, the low pass filter circuit may perform charging and discharging operations according to different pulse widths of the PWM signal $SP_{V2}$, thereby converting the PWM signal $SP_{V2}$ to the analog regenerated signal $SA_{RV}$ which may be regarded as a regenerated signal corresponding to the preprocessed signal $V_{ACO}$. FIG. 10 illustrates a waveform diagram illustrating exemplary conversion from the PWM signal $SP_{V2}$ to the analog regenerated signal $SA_{RV}$ performed by the aforementioned low pass filter circuit according to an embodiment of the present invention. In other words, the second conversion circuit 329 may convert the PWM signal $SP_{V2}$ to a regenerated signal corresponding to the preprocessed signal $V_{ACO}$ (the analog regenerated signal $SA_{RV}$). Hence, the microcontroller 330 may calculate the voltage information associated with the primary side of the power supply module 310 according to the analog regenerated signal $SA_{RV}$.

The following describes an example current detection and transmission performed by the power detection and transmission circuit 320. Please refer to FIG. 3 again. In this embodiment, the first conversion circuit 322 may be further electrically connected to a sensing resistor within the power supply module 310, so as to detect current information of the input power VI through the sensing resistor. For example, the first conversion circuit 322 may be electrically connected to a sensing resistor $R_P$ included in the PFC circuit 316 (e.g. a sensing resistor coupled to a filter capacitor $C_P$) to detect an input current signal $I_{IN}$ (i.e. an analog input signal). As the sensing resistor $R_P$ generates the input current signal $I_{IN}$ in response to the voltage signal VA, the input current signal $I_{IN}$ may reflect/indicate the current information of the input power VI. It should be noted that as the first conversion circuit 322 may detect the current information of the input power VI through a sensing resistor within the power supply module 310 directly, the power supply apparatus 300 may not need to install another sensing resistor on the input side of the power supply module 310.

After receiving the input current signal $I_{IN}$ (the analog input signal), the first conversion circuit 322 may convert the input current signal $I_{IN}$ to a corresponding digital signal (e.g. a PWM signal). For example, the first conversion circuit 322 may further include, but is not limited to, a signal amplifier 324 (labeled "X") and a comparator 327 (labeled "CP"), wherein the comparator 327 is coupled to the signal amplifier 324 and the oscillator 325. The signal amplifier 324 may amplify the input current signal $I_{IN}$ to generate a preprocessed signal $I_{ACO}$. As the oscillator 325 may transmit the oscillation signal SS to the comparator 327, the comparator 327 may compare the preprocessed signal $I_{ACO}$ with the oscillation signal SS to generate a PWM signal $SP_{I1}$. By way of example but not limitation, when a signal level of the preprocessed signal $I_{ACO}$ is greater than a signal level of the oscillation signal SS, the PWM signal $SP_{I1}$ may have a high signal level. In other words, the PWM signal $SP_{I1}$ may indicate signal information of the preprocessed signal $I_{ACO}$.

Figure 7:
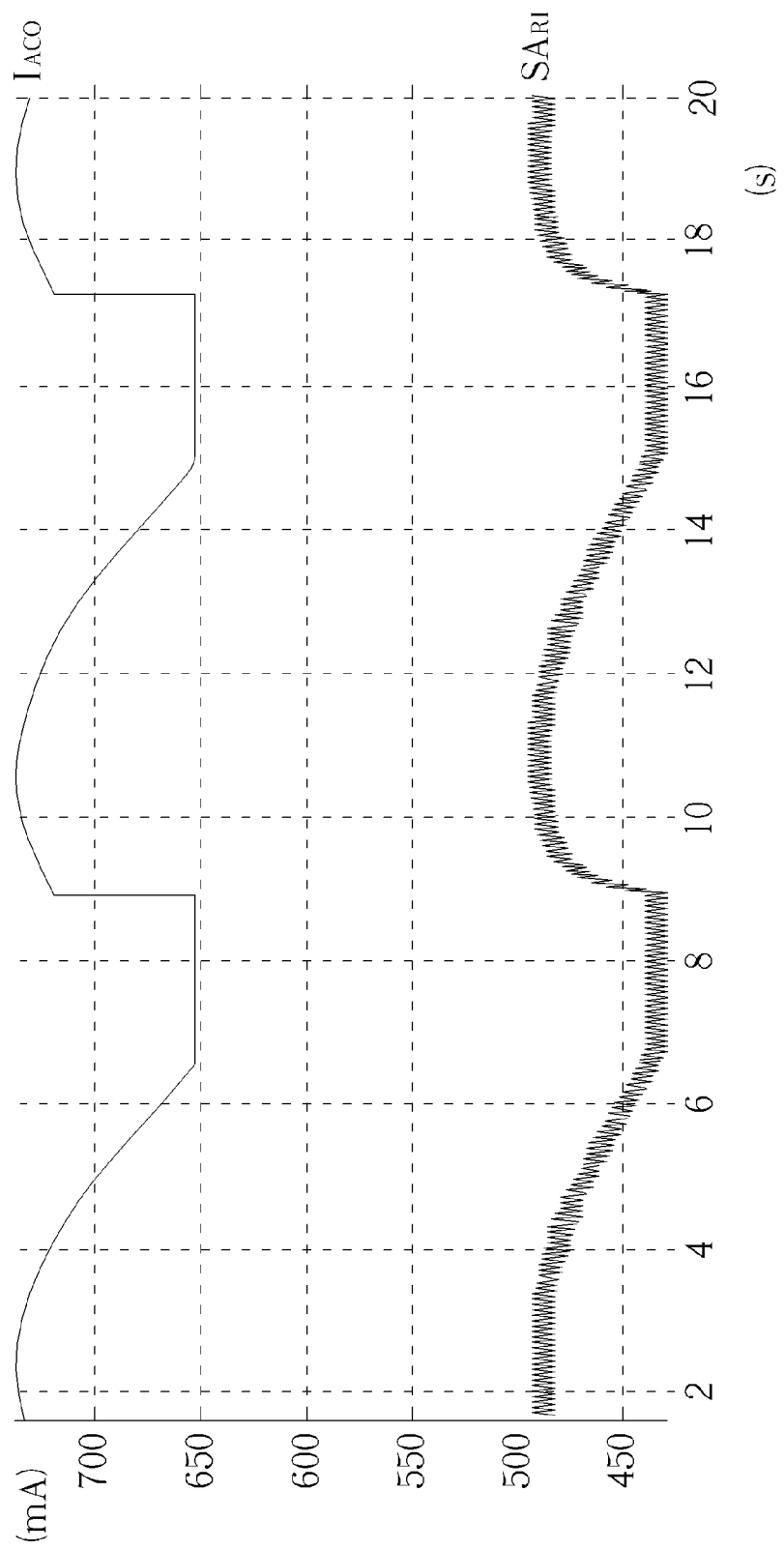
FIG. 7 is a waveform diagram illustrating an output signal of the power detection and transmission circuit shown in FIG. 3 according to an embodiment of the present invention.

Similarly, after the first conversion circuit 322 generates the PWM signal $SP_{I1}$, the photocoupler circuit 328 may couple the PWM signal $SP_{I1}$ to the second conversion circuit 329, and accordingly generate a PWM signal $SP_{I2}$. Next, the second conversion circuit 329 may convert the PWM signal $SP_{I2}$ to an analog regenerated signal $SA_{RI}$. Please refer to FIG. 7 in conjunction with FIG. 3. FIG. 7 is a waveform diagram illustrating an output signal of the power detection and transmission circuit 320 according to an embodiment of the present invention. In this embodiment, the second conversion circuit 329 may perform filter operations upon the PWM signal $SP_{I2}$ to produce the analog regenerated signal $SA_{RI}$, wherein a signal waveform of the analog regenerated signal $SA_{RI}$ (represented in units of milliamperes (mA)) may be similar/identical to a signal waveform of the preprocessed signal $I_{ACO}$ (represented in units of mA). In other words, the second conversion circuit 329 may convert the PWM signal $SP_{I2}$ to a regenerated signal corresponding to the preprocessed signal $I_{ACO}$ (the analog regenerated signal $SA_{RI}$). Hence, the microcontroller 330 may calculate the current information associated with the primary side of the power supply module 310 according to the analog regenerated signal $SA_{RI}$.

After performing the aforementioned power detection and transmission, the microcontroller 330 may calculate power information of the supply module 310 according to the received analog regenerated signals $SA_{RV}$ and $SA_{RI}$. For example, the microcontroller 330 may perform a sampling operation on the received analog regenerated signals $SA_{RV}$ and $SA_{RI}$, collect/integrate a result of the sampling operation with the detection result of the output power VO, and accordingly send the complete system power information (e.g. voltage, current, power consumption, frequency and fan speed information) through the PMBus.

It should be noted that the power detection and transmission circuit 320 may perform the aforementioned voltage detection and transmission and the aforementioned current detection and transmission simultaneously, or perform only one of the aforementioned voltage detection and transmission and the aforementioned current detection and transmission. Additionally, in a case where the power detection and transmission circuit 320 may perform the aforementioned voltage detection and transmission and the aforementioned current detection and transmission simultaneously, the input voltage signal $V_{IN}$ and input current signal $I_{IN}$ received/detected by the power detection and transmission circuit 320 may have the same phase. However, this is not meant to be a limitation of the present invention.

Furthermore, in a case where the signal coupling circuit 228 shown in FIG. 2 is implemented by the photocoupler circuit 328, since the photocoupler circuit 328 may not only effectively reduce/eliminate noise spikes/interference to improve a signal-to-noise ratio (SNR) of the signal transmission path but also have a high response speed, the power detection and transmission circuit 320 may quickly couple the power information associated with the primary side to the secondary side, thus meeting the requirements for real-time measurement and calculation of system power.

Please note that the above is for illustrative purposes only, and is not meant to be a limitation of the present invention. In one implementation, the power detection and transmission circuit 320 shown in FIG. 3 may receive a voltage signal carried through the hot line LN and a voltage signal carried through the neutral line NT directly from the input side the EMI filter 312, and use the received voltage signals as the line voltage signal $V_1$ and the neutral voltage signal $V_2$ respectively. In another implementation, the input voltage signal $V_{IN}$ and input current signal $I_{IN}$ received from the power supply module 310 may have different phases.

Figure 8:
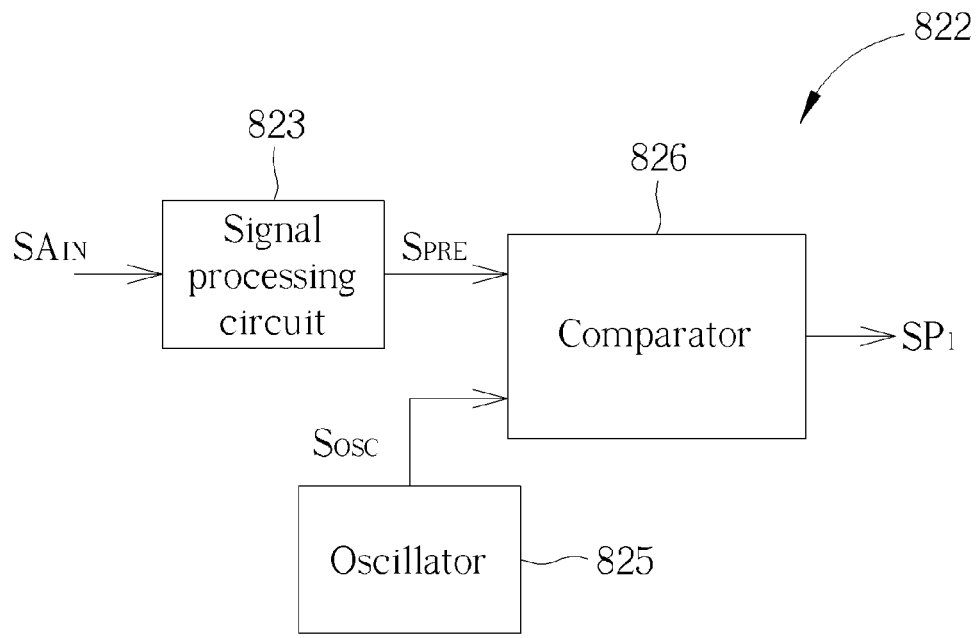
FIG. 8 is a block diagram illustrating an implementation of the first conversion circuit shown in FIG. 2 according to an embodiment of the present invention.

In addition, the circuit structure of the first conversion circuit 322 shown in FIG. 3 is not intended to limit the scope of the present invention. Please refer to FIG. 8 in conjunction with FIG. 2. FIG. 8 is a block diagram illustrating an implementation of the first conversion circuit 222 shown in FIG. 2 according to an embodiment of the present invention. In this embodiment, the first conversion circuit 822 may include a signal processing circuit 823, an oscillator 825 and a comparator 826. The signal processing circuit 823 may process the analog input signal $SA_{IN}$ outputted from the power supply module 210 shown in FIG. 2 and accordingly generate a preprocessed signal $S_{PRE}$. The oscillator 825 may generate an oscillation signal $S_{OSC}$. The comparator 826 is coupled to the signal processing circuit 823 and the oscillator 825, and is arranged for comparing the preprocessed signal $S_{PRE}$ with the oscillation signal $S_{OSC}$ to generate the PWM signal $SP_1$.

In an example where the first conversion circuit 822 performs voltage conversion, the signal processing circuit 823 may be electrically connected to an input side of a rectifier circuit included in the power supply module 210 (e.g. the rectifier circuit 314 shown in FIG. 3), and is arranged for subtracting one of a line voltage signal and a neutral voltage signal (included in the analog input signal $SA_{IN}$) from the other of the line voltage signal and the neutral voltage signal to generate the preprocessed signal $S_{PRE}$. For example, in a case where the structure of the first conversion circuit 822 is applied to the first conversion circuit 322 shown in FIG. 3, at least one part of the signal processing circuit 823 may be implemented by the signal subtractor 323 shown in FIG. 3, at least one part of the oscillator 825 may be implemented by the oscillator 325 shown in FIG. 3, and at least one part of the comparator 826 may be implemented by the comparator 326 shown in FIG. 3. As a person skilled in the art can readily understand the operation and alternative designs of the first conversion circuit 822 employed in voltage conversion after reading the above paragraphs directed FIGS. 2-4, further description is omitted here for brevity.

The first conversion circuit 822 may be employed in current conversion. For example, the signal processing circuit 823 may be electrically connected to a sensing resistor of a PFC circuit included in the power supply module 210 (e.g. the sensing resistor $R_P$ within the PFC circuit 316 shown in FIG. 3), and may be arranged for amplifying an input current signal (included in the analog input signal $SA_{IN}$) to generate the preprocessed signal $S_{PRE}$, wherein the input current signal is generated by the sensing resistor. By way of example but not limitation, in a case where the structure of the first conversion circuit 822 is applied to the first conversion circuit 322 shown in FIG. 3, at least one part of the signal processing circuit 823 may be implemented by the signal amplifier 324 shown in FIG. 3, at least one part of the oscillator 825 may be implemented by the oscillator 325 shown in FIG. 3, and at least one part of the comparator 826 may be implemented by the comparator 327 shown in FIG. 3. As a person skilled in the art can readily understand the operation and alternative designs of the first conversion circuit 822 employed in current conversion after reading the above paragraphs directed FIG. 2 and FIG. 3, further description is omitted here for brevity.

Moreover, in a case where the structure of the first conversion circuit 822 is applied to the first conversion circuit 322 shown in FIG. 3 so as to simultaneously perform the voltage conversion and the current conversion, at least one part of the signal processing circuit 823 may be implemented by the signal subtractor 323 and the signal amplifier 324 shown in FIG. 3, at least one part of the oscillator 825 may be implemented by the oscillator 325 shown in FIG. 3, and at least one part of the comparator 826 may be implemented by the comparator 326 and the comparator 327 shown in FIG. 3.

Figure 9:
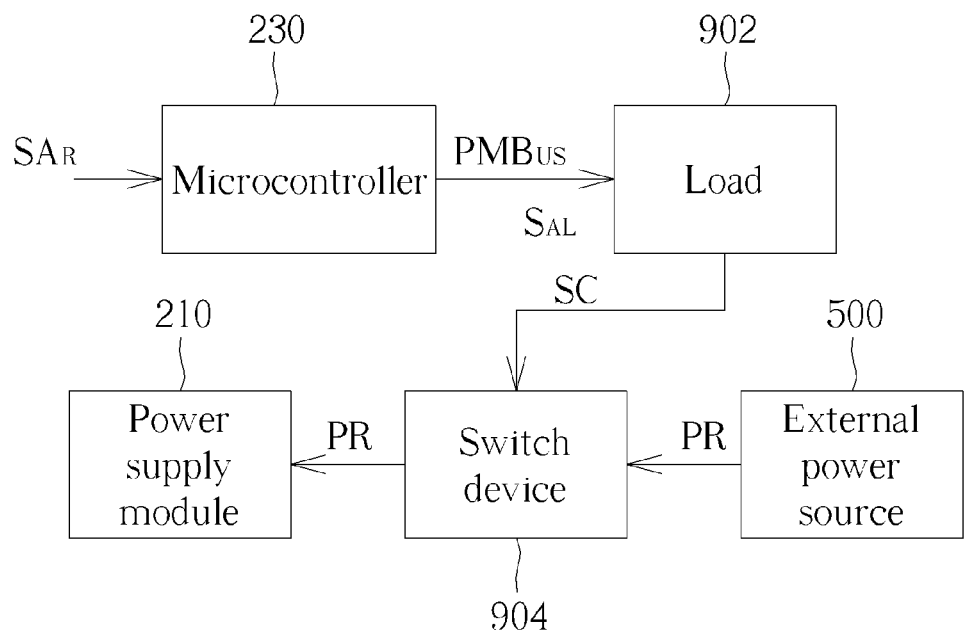
FIG. 9 is a diagram illustrating an exemplary power alerting structure utilizing the microcontroller shown in FIG. 2 according to an embodiment of the present invention.

In addition to calculating power information of a power supply module, the proposed power detection structure may determine whether an input power is normally supplied, and accordingly generate an interrupt/alert signal. Please refer to FIG. 9 in conjunction with FIG. 2. FIG. 9 is a diagram illustrating an exemplary power alerting structure utilizing the microcontroller 230 shown in FIG. 2 according to an embodiment of the present invention. In this embodiment, the microcontroller 230 may determine whether the input power VI is abnormal, and accordingly determine whether to switch a power source of the power supply module 210. For example, the microcontroller 230 may detect if a voltage level of the analog regenerated signal $SA_R$ is less than or equal to a predetermined level (e.g. 0) for more than a predetermined period of time, thereby determining whether the power supply module 210 is functioning abnormally (a relatively low voltage level of the input power VI causes power supply abnormality of the power supply module 210). When the voltage level of the analog regenerated signal $SA_R$ is less than or equal to the predetermined level for more than the predetermined period of time, the microcontroller 230 may output an alert signal $S_{AL}$ to a load 902 (e.g. a server), and accordingly enables the load 902 to instructs an external power source 500 (e.g. an uninterruptible power supply (UPS) or a battery module) to provide power PR to the power supply module 210. In this embodiment, the load 902 may generate a control signal SC in response to the alert signal $S_{AL}$, and accordingly enable a switch device 904 to provide the power PR to the power supply module 210.

Additionally, the microcontroller 230 may sample the voltage level of the analog regenerated signal $SA_R$, and accordingly determine whether the power supply module 210 is functioning abnormally. For example, in a case where a voltage component of the analog regenerated signal $SA_R$ may be implemented by the analog regenerated signal $SA_{RV}$ shown in FIG. 6, the microcontroller 230 may sample the analog regenerated signal $SA_{RV}$ having a MacDonald waveform (the voltage level of the analog regenerated signal $SA_R$) to generate a sample result, wherein the microcontroller 230 may utilize analog-to-digital conversion to sample the analog regenerated signal $SA_{RV}$ in different phases. When the sample result indicates that the voltage level of the analog regenerated signal $SA_{RV}$ (or the voltage level of the analog regenerated signal $SA_R$) is below the predetermined level a predetermined number of times consecutively (e.g. three times), the microcontroller 230 may detect that the voltage level of the analog regenerated signal $SA_R$ is less than or equal to the predetermined level for more than the predetermined period of time, thereby outputting the alert signal $S_{AL}$ to the load 902. In response to the alert signal $S_{AL}$, the load 902 may enable the switch device 904 to provide the power PR of the external power source 500 to the power supply module 210 in order to maintain normal operations of the power supply module 210.

To sum up, the proposed power detection and transmission structure may calculate complete system power information without the need for a microcontroller installed on a primary side, a UART interface and an extra sensing resistor. Thus, the proposed power detection and transmission structure may not only simplify circuit design but also reduce programming complexity, thereby greatly reducing manufacturing costs.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A power detection and transmission circuit, comprising:
   a first conversion circuit, electrically connected to a power supply module to receive an analog input signal, the first conversion circuit arranged for converting the analog input signal to a first pulse width modulation (PWM) signal;
   a second conversion circuit, for converting a second PWM signal to an analog regenerated signal, and transmitting the analog regenerated signal to a microcontroller, wherein the microcontroller calculates power information of the power supply module according to the analog regenerated signal; and
   a signal coupling circuit, coupled between the first conversion circuit and the second conversion circuit, the signal coupling circuit arranged for coupling the first PWM signal to the second conversion circuit and accordingly generating the second PWM signal.

2. The power detection and transmission circuit of claim 1, wherein the first conversion circuit comprises:
   a signal processing circuit, for processing the analog input signal to generate a preprocessed signal;
   an oscillator, for generating an oscillation signal; and
   a comparator, coupled to the signal processing circuit and the oscillator, the comparator arranged for comparing the preprocessed signal with the oscillation signal to generate the first PWM signal.

3. The power detection and transmission circuit of claim 2, wherein the analog input signal comprises a line voltage signal and a neutral voltage signal, and the signal processing circuit subtracts one of the line voltage signal and the neutral voltage signal from the other of the line voltage signal and the neutral voltage signal to generate the preprocessed signal.

4. The power detection and transmission circuit of claim 2, wherein the analog input signal comprises an input current signal, the signal processing circuit amplifies the input current signal to generate the preprocessed signal, and the input current signal is generated by a sensing resistor of the power supply module.

5. The power detection and transmission circuit of claim 1, wherein the second conversion circuit is a low pass filter circuit.

6. The power detection and transmission circuit of claim 1, wherein the signal coupling circuit further isolates the second PWM signal from the first PWM signal.

7. The power detection and transmission circuit of claim 6, wherein the signal coupling circuit is a photocoupler circuit.

8. A power detection and transmission circuit, comprising:
   a first conversion circuit, for detecting an input voltage signal and an input current signal of a power supply module, converting the input voltage signal to a first pulse width modulation (PWM) signal, and converting the input current signal to a second PWM signal, wherein the input voltage signal and the input current signal have the same phase;
   a second conversion circuit, for converting a third PWM signal to a first analog regenerated signal, converting a fourth PWM signal to a second analog regenerated signal, and transmitting the first analog regenerated signal and the second analog regenerated signal to a microcontroller, wherein the microcontroller calculates power information of the power supply module according to the first analog regenerated signal and the second analog regenerated signal; and
   a signal coupling circuit, coupled between the first conversion circuit and the second conversion circuit, the signal coupling circuit arranged for coupling the first PWM signal to the second conversion circuit and accordingly generating the third PWM signal, and coupling the second PWM signal to the second conversion circuit and accordingly generating the fourth PWM signal.

9. The power detection and transmission circuit of claim 8, wherein the input voltage signal comprises a line voltage signal and a neutral voltage signal; and the first conversion circuit comprises:
   a signal subtractor, for subtracting one of the line voltage signal and the neutral voltage signal from the other of the line voltage signal and the neutral voltage signal to generate a first preprocessed signal;
   a signal amplifier, for amplifying the input current signal to generate a second preprocessed signal, wherein the input current signal is generated by a sensing resistor of the power supply module;
   an oscillator, for generating an oscillation signal;
   a first comparator, coupled to the signal subtractor and the oscillator, the first comparator arranged for comparing the first preprocessed signal with the oscillation signal to generate the first PWM signal; and
   a second comparator, coupled to the signal amplifier and the oscillator, the second comparator arranged for comparing the second preprocessed signal with the oscillation signal to generate the second PWM signal.

10. A power supply apparatus, comprising:
    a power supply module, comprising an electromagnetic interference filter, a rectifier circuit, a power factor correction circuit and a DC/DC converter circuit;
    a power detection and transmission circuit, comprising:
        a first conversion circuit, electrically connected to the power supply module to receive an analog input signal, the first conversion circuit arranged for converting the analog input signal to a first pulse width modulation (PWM) signal;
        a second conversion circuit, for converting a second PWM signal to an analog regenerated signal; and
        a signal coupling circuit, coupled between the first conversion circuit and the second conversion circuit, the signal coupling circuit arranged for coupling the first PWM signal to the second conversion circuit and accordingly generating the second PWM signal; and
    a microcontroller, coupled to the second conversion, the microcontroller arranged for receiving the analog regenerated signal to calculate power information of the power supply module.

11. The power supply apparatus of claim 10, wherein the first conversion circuit comprises:
    a signal processing circuit, for processing the analog input signal to generate a preprocessed signal;
    an oscillator, for generating an oscillation signal; and
    a comparator, coupled to the signal processing circuit and the oscillator, the comparator arranged for comparing the preprocessed signal with the oscillation signal to generate the first PWM signal.

12. The power supply apparatus of claim 11, wherein the signal processing circuit is electrically connected to an input side of the rectifier circuit; the analog input signal comprises a line voltage signal and a neutral voltage signal; and the signal processing circuit subtracts one of the line voltage signal and the neutral voltage signal from the other of the line voltage signal and the neutral voltage signal to generate the preprocessed signal.

13. The power supply apparatus of claim 11, wherein the signal processing circuit is electrically connected to a sensing resistor of the power factor correction circuit; the analog input signal comprises an input current signal; and the signal processing circuit amplifies the input current signal to generate the preprocessed signal, and the input current signal is generated by the sensing resistor.

14. The power supply apparatus of claim 10, wherein the microcontroller detects if a voltage level of the analog regenerated signal is less than or equal to a predetermined level for more than a predetermined period of time; and when the voltage level of the analog regenerated signal is less than or equal to the predetermined level for more than the predetermined period of time, the microcontroller outputs an alert signal to a load, and accordingly enables the load to instructs an external power source to provide power to the power supply module.

15. The power supply apparatus of claim 14, wherein the microcontroller samples the voltage level of the analog regenerated signal to generate a sample result; and when the sample result indicates that the voltage level is below the predetermined level a predetermined number of times consecutively, the microcontroller detects that the voltage level is less than or equal to the predetermined level for more than the predetermined period of time.

* * * * *